US012688903B2

(12) United States Patent
Nagata et al.

(10) Patent No.: US 12,688,903 B2
(45) Date of Patent: Jul. 21, 2026

(54) SEMICONDUCTOR DEVICE AND TESTING METHOD FOR MEMORY CIRCUIT

(71) Applicant: RENESAS ELECTRONICS CORPORATION, Tokyo (JP)

(72) Inventors: Shunya Nagata, Tokyo (JP); Jun Matsushima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 51 days.

(21) Appl. No.: 18/062,262

(22) Filed: Dec. 6, 2022

(65) Prior Publication Data

US 2023/0207034 A1     Jun. 29, 2023

(30) Foreign Application Priority Data

Dec. 27, 2021     (JP) .................................. 2021-212146

(51) Int. Cl.
*G11C 11/00*          (2006.01)
*G11C 11/418*         (2006.01)
*G11C 29/12*          (2006.01)

(52) U.S. Cl.
CPC ...... *G11C 29/12005* (2013.01); *G11C 11/418* (2013.01); *G11C 2029/1202* (2013.01); *G11C 2029/1204* (2013.01)

(58) Field of Classification Search
CPC ............ G11C 29/12005; G11C 11/418; G11C 2029/1202; G11C 2029/1204; G11C 2029/5002; G11C 11/412; G11C 2029/5004; G11C 11/413; G11C 29/50; G11C 11/41; G11C 11/417; G11C 11/419; G11C 5/14; G11C 29/08

USPC .......................................................... 365/154
See application file for complete search history.

(56) References Cited

U.S. PATENT DOCUMENTS

| | | | | |
|---|---|---|---|---|
| 5,920,517 | A | * | 7/1999 | Wendell .................... H03K 5/13 |
| | | | | 365/201 |
| 5,936,892 | A | * | 8/1999 | Wendell ..................... H03L 7/08 |
| | | | | 365/189.02 |
| 5,963,490 | A | | 10/1999 | Kawamura |
| 7,570,525 | B2 | * | 8/2009 | Nii ............................ G11C 8/08 |
| | | | | 365/189.11 |

(Continued)

FOREIGN PATENT DOCUMENTS

| | | |
|---|---|---|
| JP | H10-144096 A | 5/1998 |
| JP | 2010-231853 A | 10/2010 |

(Continued)

OTHER PUBLICATIONS

Office Action dated Feb. 5, 2025, issued in corresponding Japan Patent Application No. 2021-212146, 6 pages.

*Primary Examiner* — Tha-O H Bui

(74) *Attorney, Agent, or Firm* — RIMON P.C.

(57) ABSTRACT

In an SRAM circuit mounted in a semiconductor device, power supply voltage reduction circuits generate reduction voltage obtained by reducing an external power supply voltage. A first power supply voltage selection circuit selects one of the external power supply voltage and the reduction voltage as a drive voltage supplied to a word line driver. A second power supply voltage selection circuit selects one of the external power supply voltage and the reduction voltage as a voltage of a power supply line supplying an operating voltage to a memory cell.

11 Claims, 16 Drawing Sheets

(56)                    References Cited

U.S. PATENT DOCUMENTS

| 8,611,166 | B2 * | 12/2013 | Shinozaki ............. G11C 11/413 |
| | | | 365/189.11 |
| 10,360,991 | B2 | 7/2019 | Sunada et al. |
| 2013/0135953 | A1 * | 5/2013 | Hirabayashi ..... G11C 29/50016 |
| | | | 365/201 |

FOREIGN PATENT DOCUMENTS

| JP | 2013-114728 | A | 6/2013 |
| JP | 2017-173242 | A | 9/2017 |

* cited by examiner

*FIG. 2*

| MODE | RAM OPERATION | WL POTENTIAL | PL POTENTIAL |
|---|---|---|---|
| NORMAL | WRITE | VDD | VDD |
| | READ | VDD | VDD |
| TEST | WRITE | VDD~$\alpha$ | VDD |
| | READ | VDD | VDD~$\alpha$ |

| CA | RA | OPERATION | WRITE DATA | READ DATA (EXPECTATION) | TM |
|---|---|---|---|---|---|
| 0 | 0 | WRITE | 0000 | ~ | H |
| 0 | 1 | WRITE | 1111 | ~ | H |
| 0 | 2 | WRITE | 0000 | ~ | H |
| 0 | : | : | : | ~ | H |
| 0 | : | : | : | ~ | H |
| 0 | 253 | WRITE | 1111 | ~ | H |
| 0 | 254 | WRITE | 0000 | ~ | H |
| 0 | 255 | WRITE | 1111 | ~ | H |
| 1 | 0 | WRITE | 0000 | ~ | H |
| 1 | 1 | WRITE | 1111 | ~ | H |
| 1 | 2 | WRITE | 0000 | ~ | H |
| 1 | : | : | : | ~ | H |
| 1 | : | : | : | ~ | H |
| 1 | 253 | WRITE | 1111 | ~ | H |
| 1 | 254 | WRITE | 0000 | ~ | H |
| 1 | 255 | WRITE | 1111 | ~ | H |
| : | : | : | : | ~ | H |
| : | : | : | : | ~ | H |
| 7 | 0 | WRITE | 0000 | ~ | H |
| 7 | 1 | WRITE | 1111 | ~ | H |
| 7 | 2 | WRITE | 0000 | ~ | H |
| 7 | : | : | : | ~ | H |
| 7 | : | : | : | ~ | H |
| 7 | 253 | WRITE | 1111 | ~ | H |
| 7 | 254 | WRITE | 0000 | ~ | H |
| 7 | 255 | WRITE | 1111 | ~ | H |

*FIG. 9B*

| CA | RA | OPERATION | WRITE DATA | READ DATA (EXPECTATION) | TM |
|----|----|-----------|-----------|-------------------------|----|
| 0 | 0 | READ | — | 0000 | H |
| 0 | 1 | READ | — | 1111 | H |
| 0 | 2 | READ | — | 0000 | H |
| 0 | : | : | — | : | H |
| 0 | : | : | — | : | H |
| 0 | 253 | READ | — | 1111 | H |
| 0 | 254 | READ | — | 0000 | H |
| 0 | 255 | READ | — | 1111 | H |
| 1 | 0 | READ | — | 0000 | H |
| 1 | 1 | READ | — | 1111 | H |
| 1 | 2 | READ | — | 0000 | H |
| 1 | : | : | — | : | H |
| 1 | : | : | — | : | H |
| 1 | 253 | READ | — | 1111 | H |
| 1 | 254 | READ | — | 0000 | H |
| 1 | 255 | READ | — | 1111 | H |
| : | : | : | — | : | H |
| : | : | : | — | : | H |
| 7 | 0 | READ | — | 0000 | H |
| 7 | 1 | READ | — | 1111 | H |
| 7 | 2 | READ | — | 0000 | H |
| 7 | : | : | — | : | H |
| 7 | : | : | — | : | H |
| 7 | 253 | READ | — | 1111 | H |
| 7 | 254 | READ | — | 0000 | H |
| 7 | 255 | READ | — | 1111 | H |
| 0 | 0 | READ | — | 0000 | H |
| 0 | 1 | READ | — | 1111 | H |
| 0 | 2 | READ | — | 0000 | H |
| 0 | : | : | — | : | H |
| 0 | : | : | — | : | H |
| 0 | 253 | READ | — | 1111 | H |
| 0 | 254 | READ | — | 0000 | H |

FIG. 9C

| CA | RA | OPERATION | WRITE DATA | READ DATA (EXPECTATION) | TM |
|---|---|---|---|---|---|
| 0 | 0 | WRITE | 1111 | ~ | H |
| 0 | 1 | WRITE | 0000 | ~ | H |
| 0 | 2 | WRITE | 1111 | ~ | H |
| 0 | : | : | : | ~ | H |
| 0 | : | : | : | ~ | H |
| 0 | 253 | WRITE | 0000 | ~ | H |
| 0 | 254 | WRITE | 1111 | ~ | H |
| 0 | 255 | WRITE | 0000 | ~ | H |
| 1 | 0 | WRITE | 1111 | ~ | H |
| 1 | 1 | WRITE | 0000 | ~ | H |
| 1 | 2 | WRITE | 1111 | ~ | H |
| 1 | : | : | : | ~ | H |
| 1 | : | : | : | ~ | H |
| 1 | 253 | WRITE | 0000 | ~ | H |
| 1 | 254 | WRITE | 1111 | ~ | H |
| 1 | 255 | WRITE | 0000 | ~ | H |
| : | : | : | : | ~ | H |
| : | : | : | : | ~ | H |
| 7 | 0 | WRITE | 1111 | ~ | H |
| 7 | 1 | WRITE | 0000 | ~ | H |
| 7 | 2 | WRITE | 1111 | ~ | H |
| 7 | : | : | : | ~ | H |
| 7 | : | : | : | ~ | H |
| 7 | 253 | WRITE | 0000 | ~ | H |
| 7 | 254 | WRITE | 1111 | ~ | H |
| 7 | 255 | WRITE | 0000 | ~ | H |

*FIG. 9D*

| CA | RA | OPERATION | WRITE DATA | READ DATA (EXPECTATION) | TM |
|----|----|-----------|------------|-------------------------|----|
| 0 | 0 | READ | — | 1111 | H |
| 0 | 1 | READ | — | 0000 | H |
| 0 | 2 | READ | — | 1111 | H |
| 0 | ⋮ | ⋮ | — | ⋮ | H |
| 0 | ⋮ | ⋮ | — | ⋮ | H |
| 0 | 253 | READ | — | 0000 | H |
| 0 | 254 | READ | — | 1111 | H |
| 0 | 255 | READ | — | 0000 | H |
| 1 | 0 | READ | — | 1111 | H |
| 1 | 1 | READ | — | 0000 | H |
| 1 | 2 | READ | — | 1111 | H |
| 1 | ⋮ | ⋮ | — | ⋮ | H |
| 1 | ⋮ | ⋮ | — | ⋮ | H |
| 1 | 253 | READ | — | 0000 | H |
| 1 | 254 | READ | — | 1111 | H |
| 1 | 255 | READ | — | 0000 | H |
| ⋮ | ⋮ | ⋮ | — | ⋮ | H |
| ⋮ | ⋮ | ⋮ | — | ⋮ | H |
| 7 | 0 | READ | — | 1111 | H |
| 7 | 1 | READ | — | 0000 | H |
| 7 | 2 | READ | — | 1111 | H |
| 7 | ⋮ | ⋮ | — | ⋮ | H |
| 7 | ⋮ | ⋮ | — | ⋮ | H |
| 7 | 253 | READ | — | 0000 | H |
| 7 | 254 | READ | — | 1111 | H |
| 7 | 255 | READ | — | 0000 | H |
| 0 | 0 | READ | — | 1111 | H |
| 0 | 1 | READ | — | 0000 | H |
| 0 | 2 | READ | — | 1111 | H |
| 0 | ⋮ | ⋮ | — | ⋮ | H |
| 0 | ⋮ | ⋮ | — | ⋮ | H |
| 0 | 252 | READ | — | 0000 | H |
| 0 | 253 | READ | — | 1111 | H |
| 0 | 254 | READ | — | 0000 | H |

| TM1 | LOW | HIGH | LOW | HIGH |
|---|---|---|---|---|
| TM2 | LOW | LOW | HIGH | HIGH |
| $\alpha$ | 0 | SMALL | MEDIUM | LARGE |

```
        ( START )
            │
            ▼          S401
  ┌──────────────────────────┐
  │ MEASURE & STORE T1, T2, T3 │
  └──────────────────────────┘
            │
            ▼          S402
  ┌──────────────────────────┐
  │       CALCULATE T4         │
  └──────────────────────────┘
            │
            ▼          S403
  ┌──────────────────────────┐
  │        OUTPUT T4           │
  └──────────────────────────┘
            │
            ▼
        ( END )
```

SEMICONDUCTOR DEVICE AND TESTING METHOD FOR MEMORY CIRCUIT

CROSS-REFERENCE TO RELATED APPLICATIONS

The present application claims priority from Japanese Patent Application No. 2021-212146 filed on Dec. 27, 2021, the content of which is hereby incorporated by reference to this application.

BACKGROUND

The present disclosure relates to a semiconductor device and a testing method for a SRAM circuit, for example, to a technique for predicting lifetime of an SRAM (Static Random Access Memory).

Japanese Patent Application Laid-open No. 2017-173242 (Patent Document 1), for example, has been known as a technique for notifying a user that a semiconductor device may fail before the semiconductor device fails.

Specifically, the semiconductor device disclosed in this document includes functional units and a life prediction circuit. One of the functional units is a central processing circuit. The life prediction circuit acquires a deterioration degree of the functional unit by lowering a power supply voltage of a semiconductor device and performing a test about the functional unit. The life prediction circuit notifies the user that the lifetime of the semiconductor device is approaching when the deterioration degree exceeds a predetermined threshold.

SUMMARY

In a case of the technique disclosed in Japanese Patent Application Laid-open No. 2017-173242 (Patent Document 1), the power supply voltage of the entire semiconductor device needs to being lowered in performing a deterioration prediction test. Consequently, the deterioration prediction test can be performed only when the semiconductor device is powered on, and the deterioration degree of the semiconductor device cannot be tested while the user is using it.

The other problems and novel features will be apparent from the descriptions of the present specification and the accompanying drawings.

An SRAM circuit mounted in a semiconductor device according to one embodiment includes a power supply voltage reduction circuit, a first power supply voltage selection circuit, a second power supply voltage selection circuit. The power supply voltage reduction circuit generates a reduction voltage obtained by reducing an external power supply voltage. The first power supply voltage selection circuit selects, as a drive voltage supplied to a word line driver, one of the external power supply voltage and the reduction voltage. The second power supply voltage selection circuit selects, as a voltage of a power supply line supplying an operating voltage to a memory cell, one of the external power supply voltage and the reduction voltage.

According to the above-mentioned embodiment, the deterioration degree of the SRAM circuit mounted in the semiconductor device can be executed while the user is using it.

BRIEF DESCRIPTION OF THE DRAWINGS

FIG. 2 is a view summarizing, in a tabular form, potentials of a word line WL and a power supply line PL according to operation modes.

FIG. 6 is a block diagram showing an overall configuration of a semiconductor device according to a first embodiment.

FIG. 7 is a flowchart showing a procedure for a power-on diagnostics.

FIG. 8 is a flowchart showing a procedure for a runtime diagnostics.

FIG. 9A is a diagram for explaining one example of a procedure for performing a deterioration prediction test in FIG. 8.

FIG. 9B is a diagram for explaining one example of a procedure for performing the deterioration prediction test in FIG. 8.

FIG. 9C is a diagram for explaining one example of a procedure for performing the deterioration prediction test in FIG. 8.

FIG. 9D is a diagram for explaining one example of a procedure for performing the deterioration prediction test in FIG. 8.

DETAILED DESCRIPTION

Figure 1:
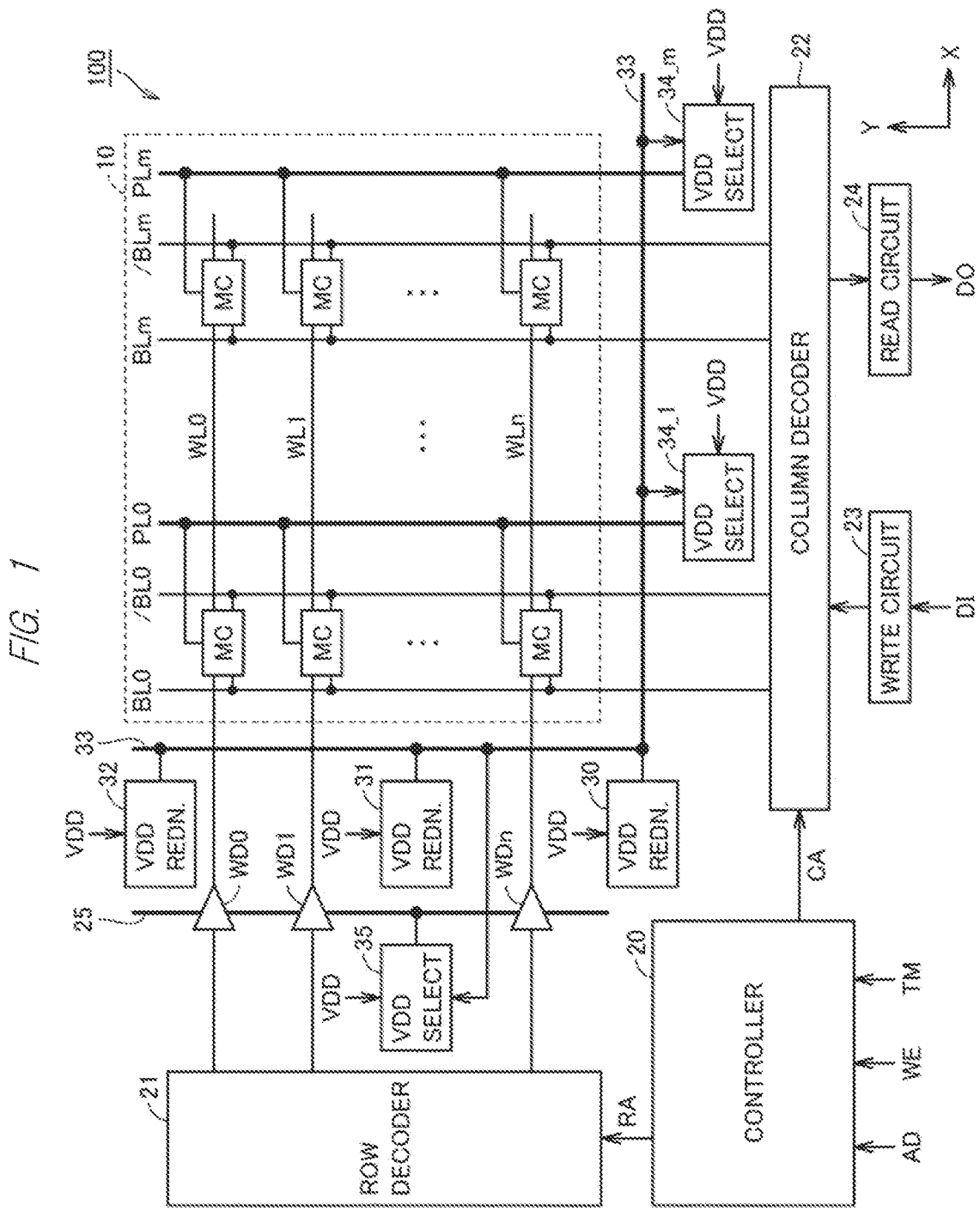
FIG. 1 is a view schematically showing an overall configuration of an SRAM circuit.

Hereinafter, each embodiment about deterioration prediction of a SRAM will be detailed with reference to the drawings. Incidentally, the same or corresponding components are denoted by the same reference numerals, and a description thereof may not be repeated.

First Embodiment

[Schematic Configuration of SRAM]

FIG. 1 is a view schematically showing an overall configuration of an SRAM circuit. In the present specification, an SRAM circuit is referred to also as an SRAM macro (MACRO).

As shown in FIG. 1, an SRAM circuit 100 includes a memory cell array 10 in which memory cells MC are arranged in a matrix form. In an example of FIG. 1, the memory cells MC having (n+1) rows and (m+1) columns are provided. Hereinafter, a row direction of the memory cell array 10 will be referred to also as an X direction, and a column direction of the memory cell array 10 will be referred to also as a Y direction. A detailed configuration of each memory cell MC will be described later with reference to FIG. 3.

Word lines WL0 to WLn are provided so as to correspond to the rows of the memory cell array 10. The word lines WL0 to WLn are electrically connected to the respective memory cells MC of the corresponding rows. Bit line pairs BL0, /BL0 to BLm, /BLm are provided so as to correspond to the columns of the memory cell array 10. Each of the bit line pairs BL0, /BL0 to BLm, /BLm is electrically connected to each memory cell MC of the corresponding columns. Further, power supply lines PL0 to PLm are provided so as to correspond to the columns of the memory cell array 10. Each of the power supply lines PL0 to PLm supplies an operating voltage to each memory cell MC of the corresponding columns. Incidentally, as described later, an external power supply voltage VDD and a reduction voltage VDD-α obtained by lowering the external power supply voltage VDD can be selectively supplied as the operating voltage.

In the following description, the word lines WL0 to WLn are referred to as a word line WL when they are generically referred to or when any one of them is indicated. The bit line pairs BL0, /BL0 to BLm, /BLm are referred to as a bit line pair BL, /BL when they are generically referred to or when any one pair is indicated. The power supply lines PL0 to PLm are referred to as a power supply line PL when they are generically referred to or when any one of them is indicated.

The SRAM circuit 100 includes a row decoder (ROW DECODER) 21 and word line drivers WD0 to WDn to control the word line WL. The row decoder 21 generates a row selection signal according to a row address signal RA. Each of the word line drivers WD0 to WDn drives each corresponding word line out of the word lines WL0 to WLn to a power supply voltage according to the row selection signal. The word line drivers WD0 to WDn are connected to a power supply line 25, thereby receiving a supply of a power supply voltage. As described later, the power supply voltage supplied to the word line drivers WD0 to WDn can also be selected from the external power supply voltage VDD and the reduction voltage VDD-α obtained by lowering the external power supply voltage VDD. Incidentally, in the following description, the word line drivers WD0 to WDn are referred to as a word line driver WD when they are generically referred to or when any one of them is indicated.

Furthermore, the SRAM circuit 100 includes a column decoder (COLUMN DECODER) 22, a write circuit (WRITE CIRCUIT) 23, and a read circuit (READ CIRCUIT) 24. These are provided for controlling a voltage of the above-mentioned bit line pair BL, /BL. Specifically, the column decoder 22 selects a column of the memory cell array 10 according to a column address signal CA. A plurality of columns are usually selected once. Then, the column decoder 22 electrically connects the bit line pair BL, /BL of the selected column and the write circuit 23 at data write. The column decoder 22 electrically connects the bit line pair BL, /BL of the selected column and the read circuit 24 at data read.

The write circuit 23 includes an input buffer and a write drive circuit, and generates internal write data according to external write data DI at the data write. The write drive circuit drives one of the bit line pair BL, /BL of the selected column to a H (High) level and the other to a L (Low) level according to the internal write data. The read circuit 24 includes a sense amplifier circuit and an output buffer. At the data read, the sense amplifier senses and amplifies a potential difference occurring in the bit line pair BL, /BL of the selected column. The output buffer generates external read data DO based on the potential difference sensed and amplified by the sense amplifier.

Further, the SRAM circuit 100 includes power supply voltage reduction circuits (VDD REDN.) 30 to 32 and power supply voltage selection circuits (VDD SELECT) 34_0 to 34_m and 35. These circuits are used in a test mode.

Each of the power supply voltage reduction circuits 30 to 32 generates a reduction voltage VDD-α obtained by reducing the externally supplied external power supply voltage VDD, and outputs the generated reduction voltage VDD-α to the voltage supply line 33. In the example of FIG. 1, the power supply voltage reduction circuits 30 to 32 and the voltage supply line 33 are arranged between the memory cell array 10 and the row decoder 21 along a Y direction. The voltage supply line 33 is further arranged between the memory cell array 10 and the column decoder 22 along an X direction. The power supply voltage reduction circuits 30, 32 that are arranged at both ends in the Y direction always operate in a test pmode. The Power supply voltage reduction circuit 31 selectively operates in the test mode. Although only one power supply voltage reduction circuit 31 is representatively shown in FIG. 1, a plurality of power supply voltage reduction circuits 31 are actually provided between the power supply voltage reduction circuits 30 and 32.

The power supply voltage selection circuits 34_1 to 34_m are individually arranged for each column of the memory cell array 10 between the memory cell array 10 and the column decoder 22. In the following description, the power supply voltage selection circuits 34_1 to 34_m are referred to as a power supply voltage selection circuit 34 when they are generically referred to or when any one of them is indicated. Each power supply voltage selection circuit 34 selects, as a power supply voltage, one of the external power supply voltage VDD and the reduction voltage VDD-α supplied from the voltage supply line 33. Each power supply voltage selection circuit 34 supplies the selected power supply voltage to a corresponding power supply line PL. Here, each power supply voltage selection circuit 34 selects the reduction voltage VDD-α for the memory cells MC of the corresponding column in the test mode and a data read mode. The power supply voltage selection circuit 34 selects the external power supply voltage VDD in other cases.

The power supply voltage selection circuit 35 is arranged between the memory cell array 10 and the row decoder 21. In FIG. 1, only one is shown as a representative, but a plurality of power supply voltage selection circuits are actually arranged in the Y direction. Further, as shown in FIG. 1, the power supply voltage selection circuit 35 is arranged in the X direction with respect to and adjacent to the power supply voltage selection circuit 34. The power supply voltage selection circuit 35 selects, as a power supply voltage, one of the external power supply voltage VDD and the reduction voltage VDD-α supplied from the voltage supply line 33. The power supply voltage selection circuit 35 supplies the selected power supply voltage to the power supply line 25 for the word line driver WD. Consequently, the selected power supply voltage (that is, VDD or VDD-α) is supplied to the word line WL in the row selected by the row decoder 21. Here, the power supply voltage selection circuit 35 selects the reduction voltage VDD-α as a power supply voltage in the test mode and the data write mode. The power supply voltage selection circuit 35 selects the external power supply voltage VDD in other cases.

Furthermore, the SRAM circuit 100 includes a controller 20 that wholly controls the above-mentioned components. The controller 20 receives an address signal AD, a write enable signal WE, and a test mode signal TM as control signals from an outside the SRAM circuit 100. The controller 20 generates a row address signal RA and a column address signal CA from the address signal AD. The present embodiment is in a data write mode when the write enable signal WE is asserted, and is in a data read mode when the write enable signal WE is negated. Further, the present embodiment is in a test mode when the test mode signal TM is asserted, and is in a normal mode when the test mode signal TM is negated.

FIG. 2 is a view summarizing, in a tabular form, potentials of a word line WL and a power supply line PL according to operation modes. As described with reference to FIG. 1, the mode (MODE) includes a normal (NORMAL) mode and a test (TEST) mode. In addition, a RAM operation (OPERATION) includes data write (WRITE) and data read (READ).

As shown in FIG. 2, in the normal mode, all of a word line potential (WL POTENTIAL) and a power supply potential (PL POTENTIAL) are external power supply potentials VDD. In the test mode and at a data write operation, the word line potential of the selected row is set to a reduction potential VDD-$\alpha$. In this case, the power supply line potential for the memory cell MC remains at the external power supply potential VDD. In the test mode and at a data read operation, the power supply line potential for the memory cell MC is set to the reduction voltage VDD-$\alpha$. In this case, the word line potential remains at the external power supply voltage VDD. Incidentally, in the following description, unless specifically needing to be distinguished, a potential and a voltage (voltage difference with respect to a reference potential) are identified.

Next, an effect of applying the above-mentioned reduction voltage VDD-$\alpha$ to the power supply line PL and the word line WL will be described. First, a configuration and a basic operation of the memory cell in the SRAM will be briefly described below with reference to FIG. 3 and, then, the effect of applying the reduction voltage VDD-$\alpha$ will be described. As detailed below, applying the reduction voltage VDD-$\alpha$ has an effect of tightening (that is, reducing) an operating margin of the memory cell MC in the SRMM.

[Configuration and Basic Operation of Memory Cell in SRAM]

Figure 3:
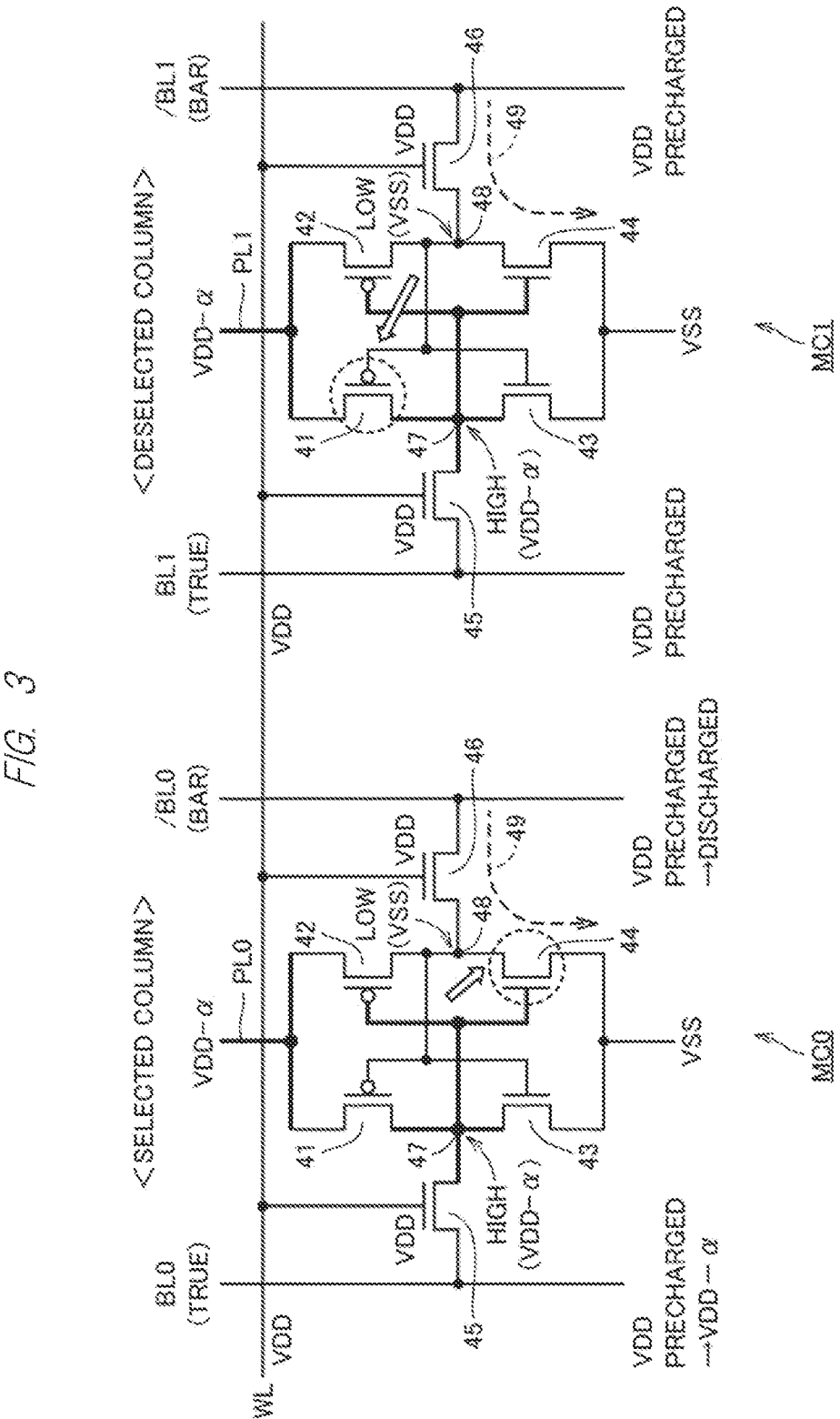
FIG. 3 is a diagram for explaining an effect of applying a reduction voltage to the power supply line in reading data.

Referring to FIG. 3, a memory cell MC0 has a basic configuration of a latch circuit composed of two CMOS (Complementary Metal Oxide Semiconductor) inverters. Further, the memory cell MC0 includes two NMOS (N-channel MOS) access transistors 45, 46 connected to the latch circuit. Other memory cells MC also have the same configuration.

The latch circuit is configured by a first CMOS inverter and a second CMOS inverter. The first CMOS inverter includes a PMOS (P-channel MOS) load transistor 41 and an NMOS drive transistor 43 that are connected in series between the power supply line PL0 and the ground VSS. The second CMOS inverter includes a PMOS load transistor 42 and an NMOS drive transistor 44 that are connected in series between the power supply line PL0 and the ground VSS. A connection node 47 between the load transistor 41 and the drive transistor 43 is connected to gates of the load transistor 42 and the drive transistor 44. A connection node 48 between the load transistor 42 and the drive transistor 44 is connected to gates of the load transistor 41 and the drive transistor 43.

The access transistor 45 is connected between the connection node 47 and the bit line BL0 (TRUE). The access transistor 46 connects between the connection node 48 and the bit line /BL0 (BAR). Gates of the access transistors 45, 46 are connected to a common word line WL.

The memory cell MC0 holds complementary voltages (one is at a H level and the other is at an L level) at the connection nodes 47, 48. A procedure for a writing operation will be briefly described below. For example, a case where the connection node 47 is held at a H level voltage and the connection node 48 is held at an L level voltage will be described. In this case, first, a voltage of the bit line BL0 is set to the H level, and a voltage of the bit line /BL0 is set to the L level. Next, by maintaining for a predetermined time a state in which the voltage of the word line WL is changed from the L level to the H level, the voltage of the connection node 47 changes to the H level and the voltage of the connection node 48 changes to the L level.

Next, a procedure for a reading operation will be briefly described. It is assumed that the voltage of the connection node 47 is preset at the H level and the voltage of the connection node 48 is preset at the L level. First, the bit line pair BL0, /BL0 is precharged (VDD PRECHARGED) to the power supply voltage. Thereafter, When the voltage of the word line WL is changed from the L level to the H level, the voltage of the bit line BL connected to the connection node 47 holding the H level voltage does not change, whereas the voltage of the bit line /BL0 connected to the connection node 48 holding the L level voltage drops. By amplifying a voltage difference between the bit lines BL0 and /BL0 with a sense amplifier (not shown) provided in the read circuit 24, data held in the memory cell MC can be read.

[Effect of Applying Reduction Voltage VDD-$\alpha$ to Power Supply Line at Data Read]

Next, an effect of applying the reduction voltage VDD-$\alpha$ to the power supply line PL in the test mode (test mode signal TM=H level) and at the data read (write enable signal WE=L level) will be described. The voltage of the word line WL is not lowered from the external power supply voltage VDD.

FIG. 3 is a diagram for explaining an effect of applying a reduction voltage to the power supply line at the data read. FIG. 3 shows two memory cells MC0, MC1 connected to the same word line WL which is the selected row. The memory cell MC0 is a memory cell in a selected column (SELECTED COLUMN), and the memory cell MC1 is a memory cell in a deselected column (DESELECTED COLUMN). In each of the memory cells MC0, MC1, the H level voltage is held in the connection node 47, and the L level voltage is held in the connection node 48.

In the test mode (TM=H) and at the data read (WE=L), the voltages of the power supply lines PL0, PL1 are reduced from the external power supply voltage VDD to the reduction voltage VDD-$\alpha$. In this case, in the memory cells MC0, MC1, since the connection node 48 is at the L level, the load transistor 41 becomes an ON-state. As a result, a voltage of a wiring portion including the connection node 47 indicated by thick lines in FIG. 3 becomes the reduction voltage VDD-$\alpha$.

At the data read, first, the bit line pairs BL0, /BL0 and BL1, /BL1 are precharged to the external power supply voltage VDD. Then, the external power supply voltage VDD is applied to the word line WL. Consequently, the access transistors 45, 46 are switched to conducting states in each of the memory cells MC0, MC1.

At this time, in the memory cell MC0 of the selected column, the drive transistor 44 may not become sufficiently an ON-state since the voltage of the connection node 47 is the reduction voltage VDD-$\alpha$. In this case, a discharge current 49 flowing from the bit line /BL0 through the drive transistor 44 to the ground VSS is limited. As a result, the discharge (DISCHARGED) of the bit line /BL0 becomes insufficient, and if the voltage difference between the bit line pair BL0, /BL0 is insufficient, some errors may occur in detection by the read circuit 24. That is, by applying the reduction voltage VDD-α to the power supply line PL0, a read margin of the memory cell MC0 in the selected column can be slightly tightened.

The same is true for the memory cell MC1 in the deselected column. Specifically, since the voltage of the connection node 47 is the reduction voltage VDD-α, the drive transistor 44 may not become sufficiently the ON-state and discharge of the bit line /BL0 may be limited. In this case, the voltage of the connection node 48 hardly drops from the precharged voltage VDD. As a result, the load transistor 41 switches to a non-conducting state and the drive transistor 43 switches to a conducting state, which brings inversion of the data stored in the memory cell MC1 of the deselected column. That is, by applying the reduction voltage VDD-α to the power supply line PL0, a static noise margin of the memory cells MC1 in the deselected columns can be slightly tightened.

As detailed later, the read test is performed with an operating margin tightened as described above. In the read test, performed is a test of whether the already written data is correctly read and further whether data inversion occurs in the memory cells MC of the deselected columns. Consequently, even if the memory cell is normal at present, the deterioration prediction test about whether any failure will occur in the future can be performed.

[Effect of Applying Reduction Voltage VDD-α to Word Line at Data Write]

Next, an effect of applying the reduction voltage VDD-α to the word line WL in the test mode (test mode signal TM=H level) and at the data write (write enable signal WE=H level) will be described. The voltage of the power supply line PL is not lowered from the external power supply voltage VDD.

Figure 4:
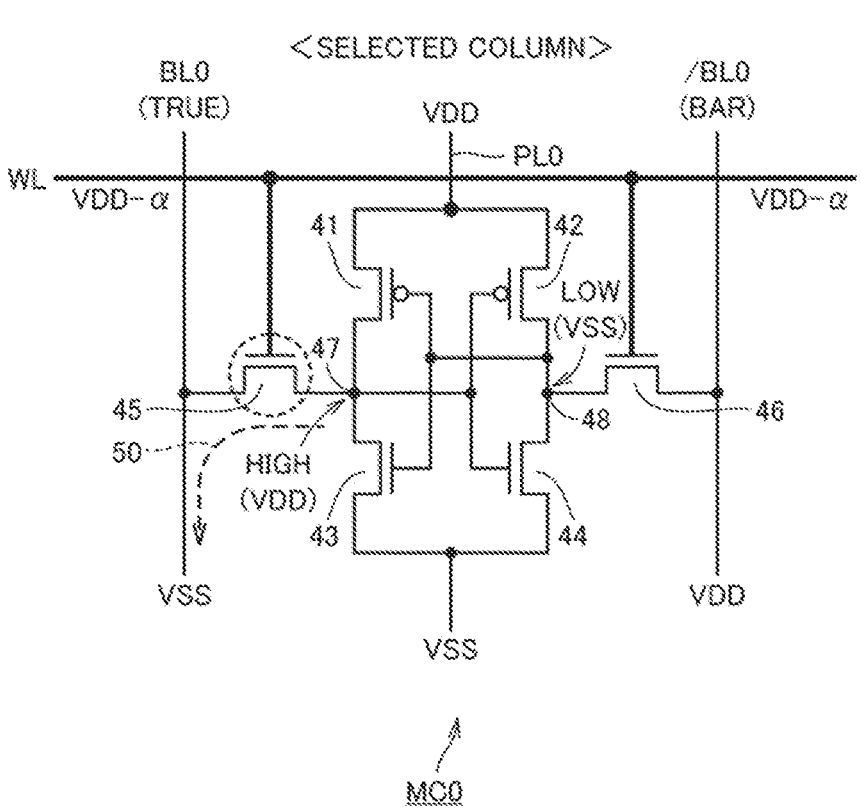
FIG. 4 is a diagram for explaining an effect of applying a reduction voltage to the word line in write data.

FIG. 4 is a diagram for explaining an effect of applying a reduction voltage to the word line at the data write. FIG. 4 shows the memory cell MC0 connected to the word line WL in the selected row. The memory cell MC0 is a memory cell in the selected column. The memory cell in the deselected column has no connection with the test.

In the memory cell MC0 before the data write, the H level voltage is held in the connection node 47, and the L level voltage is held in the connection node 48. In order to write a logic value opposite to a logic value of the held data into memory cell MC0, the bit line BL0 is set to an L level (VSS) and the bit line /BL0 is set to a H level (VDD). In this state, an H level voltage is supplied to the word line WL. In the test mode (TM=H) and at the data write (WE=H), the voltage of the word line WL is the reduction voltage VDD-α, so that the access transistor 45 may not become sufficiently an ON-state. In this case, a discharge current 50 flowing into the bit line BL0 from the connection node 47 through the access transistor 45 is limited. As a result, the voltage of the connection node 48 hardly changes from the power supply voltage VDD, and no inversion of the stored data occurs. That is, by applying the reduction voltage VDD-α to the word line WL, the write margin of the memory cell MC0 in the selected column can be slightly tightened.

As detailed later, the write test is performed with the write margin tightened as described above. In the write test, performed a test about whether the data is correctly written by reading the data written in the memory cell MC. Consequently, even if the memory cell is normal at present, the deterioration prediction test about whether any failure will occur in the future can be performed.

[Each One Example of Power Supply Voltage Rection Circuit and Power Supply Voltage Selection Circuit]

Figure 5:
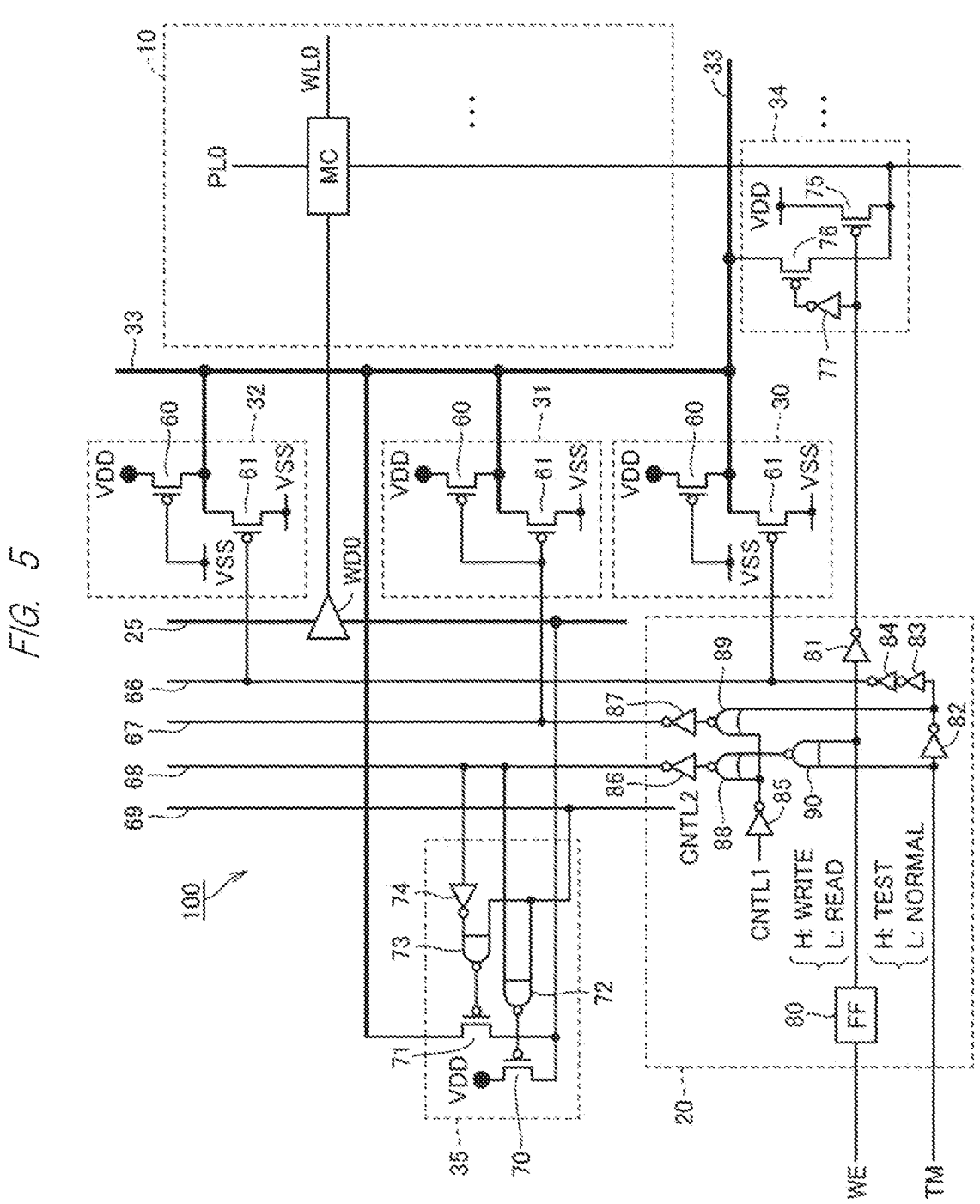
FIG. 5 is a circuit diagram showing one example of each circuit configuration of a power supply voltage reduction circuit and a power supply voltage selection circuit of FIG. 1.

FIG. 5 is a circuit diagram showing one example of each circuit configuration of the power supply voltage reduction circuit and the power supply voltage selection circuit of FIG. 1. One example of each circuit configuration of the power supply voltage reduction circuits 30 to 32 and the power supply voltage selection circuits 34, 35 shown in FIG. 1 will be described below with reference to FIG. 5.

Incidentally, although FIG. 5 representatively shows the power supply voltage selection circuit 34 connected to the power supply line PL0, a configuration of the power supply voltage selection circuits 34 connected to other power supply lines PL is also the same. Further, FIG. 5 shows a circuit configuration of a portion, which has a connection with controlling of the power supply voltage reduction circuits 30 to 32 and the power supply voltage selection circuits 34, 35, in the controller 20 of FIG. 1. Specifically, the controller 20 includes a flip-flop (FF) 80, inverters 81 to 87, NOR circuits 88, 89, and a NAND circuit 90. A configuration of these logic circuits is one example, and other configurations having similar functions may be used.

As shown in FIG. 5, each of the power supply voltage reduction circuits 30 to 32 includes PMOS transistors 60, 61 connected in series to each other. The PMOS transistor 60 is connected between a power supply node (hereinafter referred to as VDD node) to which the external power supply voltage VDD is applied and a voltage supply line 33. The PMOS transistor 61 is connected between a ground to which the reference voltage VSS is applied and the voltage supply line 33.

Here, a current supply capability of the PMOS transistor 60 is large, and a current supply capability of the PMOS transistor 61 is small. For example, a ratio W/L of a channel width W and a channel length L of the PMOS transistor 60 is formed larger than a ratio W/L of the PMOS transistor 61. Due to this difference in current supply capability, when both the PMOS transistors 60, 61 are the ON-states, the reduction voltage VDD-α which is a voltage lower than the external power supply voltage VDD is supplied to the voltage supply line 33.

In a case of the power supply voltage reduction circuits 30, 32, the reference voltage VSS is inputted to the gate of the PMOS transistor 60, and the gate of the PMOS transistor 61 is connected to a signal line 66. A test mode signal TM is supplied to the signal line 66 via the inverters 82, 83, 84. Therefore, in the non-test mode (TM=L level), the PMOS transistor 60 becomes the ON-state and the PMOS transistor 61 becomes an OFF-state. In this case, the power supply voltage reduction circuits 30, 32 supply the external power supply voltage VDD to the voltage supply line 33. Meanwhile, in the test mode (TM=H level), both the PMOS transistors 60, 61 become the ON-states. In this case, the power supply voltage reduction circuits 30, 32 supply the reduction voltage VDD-α to the voltage supply line 33.

In a case of the power supply voltage reduction circuit 31, each gate of the PMOS transistors 60, 61 is connected to a signal line 67. Inputted in the signal line 67 are an OR operation result of a signal obtained by inverting a test mode signal TM by the inverter 82 and a signal obtained by inverting a control signal CNTL1 by the inverter 85. In a case of FIG. 5, the OR operation is realized by series connection of the NOR circuit 89 and the inverter 87. Therefore, in the test mode (TM=H level) and when the control signal CNTL1 is at an H level, the PMOS transistors 60, 61 become the ON-states. In this way, the power supply voltage reduction circuit 31 is controlled so as to temporarily generate the reduction voltage VDD-α in response to the control signal CNTL1 during the test mode (TM=H level). In other cases, the power supply voltage reduction circuit 31 supplies no voltage.

The power supply voltage selection circuit 34 includes PMOS transistors 75, 76 and an inverter 77. The PMOS transistor 75 is connected between a VDD node and the power supply line PL0. The PMOS transistor 76 is connected between a voltage supply line 33 and the power supply line PL0. A write enable signal WE is inputted to a gate of the PMOS transistor 75 via a flip-flop (FF) 80 and an inverter 81. The write enable signal WE is inputted to a gate of the PMOS transistor 76 via the flip-flop 80 and the inverters 81, 77.

According to the above-mentioned connection, during the write operation (WE=H level), the PMOS transistor 75 becomes an ON-state and the PMOS transistor 76 becomes an OFF-state. Therefore, the external power supply voltage VDD is supplied to the power supply line PL0. Meanwhile, during the read operation (WE=L level), the PMOS transistor 75 becomes an OFF-state and the PMOS transistor 76 becomes an ON-state. Therefore, the voltage of voltage supply line 33 is supplied to the power supply line PL0. The voltage of the voltage supply line 33 is the reduction voltage VDD-α in the test mode (TM=H level), and is the external power supply voltage VDD in the non-test mode (TM=L level).

The power supply voltage selection circuit 35 includes PMOS transistors 70, 71, NAND circuits 72, 73, and an inverter 74. The PMOS transistor 70 is connected between the VDD node and the power supply line 25 for word line driver WD0. The PMOS transistor 71 is connected between the voltage supply line 33 and the power supply line 25. A NAND operation result of a logic level of the signal line 68 and a logic level of the signal line 69 is inputted to a gate of the PMOS transistor 70. Inputted in a gate of the PMOS transistor 71 is a NAND operation result of a value, which is obtained by inverting the logic level of the signal line 68 by the inverter 74, and a logic level of the signal line 69. Inputted in the signal line 68 is an OR operation result of: a NAND operation result of the test mode signal TM and the write enable signal WE; and a value obtained by inverting the control signal CNTL1 by the inverter 85. An OR operation in this case is realized by series connection of a NOR circuit 88 and the inverter 86. A control signal CNTL2 is inputted into the signal line 69.

According to the above-mentioned connection, when the control signal CNTL2 is at the L level, both the PMOS transistors 70, 71 become OFF-states, so that no power supply voltage is inputted into the power supply line 25. Meanwhile, when the control signal CNTL2 is at the H level, the following control is performed.

(i) Regarding a case where the control signal CNTL1, test mode signal TM, and write enable signal WE are both at H levels, in this case, the PMOS transistor 70 becomes the OFF-state and the PMOS transistor 71 becomes the ON-state. Therefore, the reduction voltage VDD-α is supplied from the voltage supply line 33 to the power supply line 25 for word line driver WD0.

(ii) Regarding a case where the control signal CNTL1 is at the H level and at least one of the test mode signal TM and the write enable signal WE is at the L level, in this case, the PMOS transistor 70 becomes the ON-state and the PMOS transistor 71 becomes the OFF-state. Therefore, the external power supply voltage VDD is supplied to the power supply line 25 for word line driver WD0.

(iii) Regarding a case where the control signal CNTL1 is at the L level, in this case, the PMOS transistor 70 becomes the ON-state and the PMOS transistor 71 becomes the OFF-state. Therefore, the external power supply voltage VDD is supplied to the power supply line 25 for word line driver WD0.

Although one test mode signal TM is used in the above description for simplicity, different test mode signals TM may be used for each region of the memory cell array 10. Consequently, the reduction voltage VDD-α can be applied only to a specific region while the SRAM circuit 100 is being operated.

[Deterioration Prediction Test]

Next, a method of performing a deterioration prediction test of the SRAM circuit by using the above-mentioned power supply voltage reduction circuits 30 to 32 and the power supply voltage selection circuits 34, 35 will be described.

Figures 6, 7:
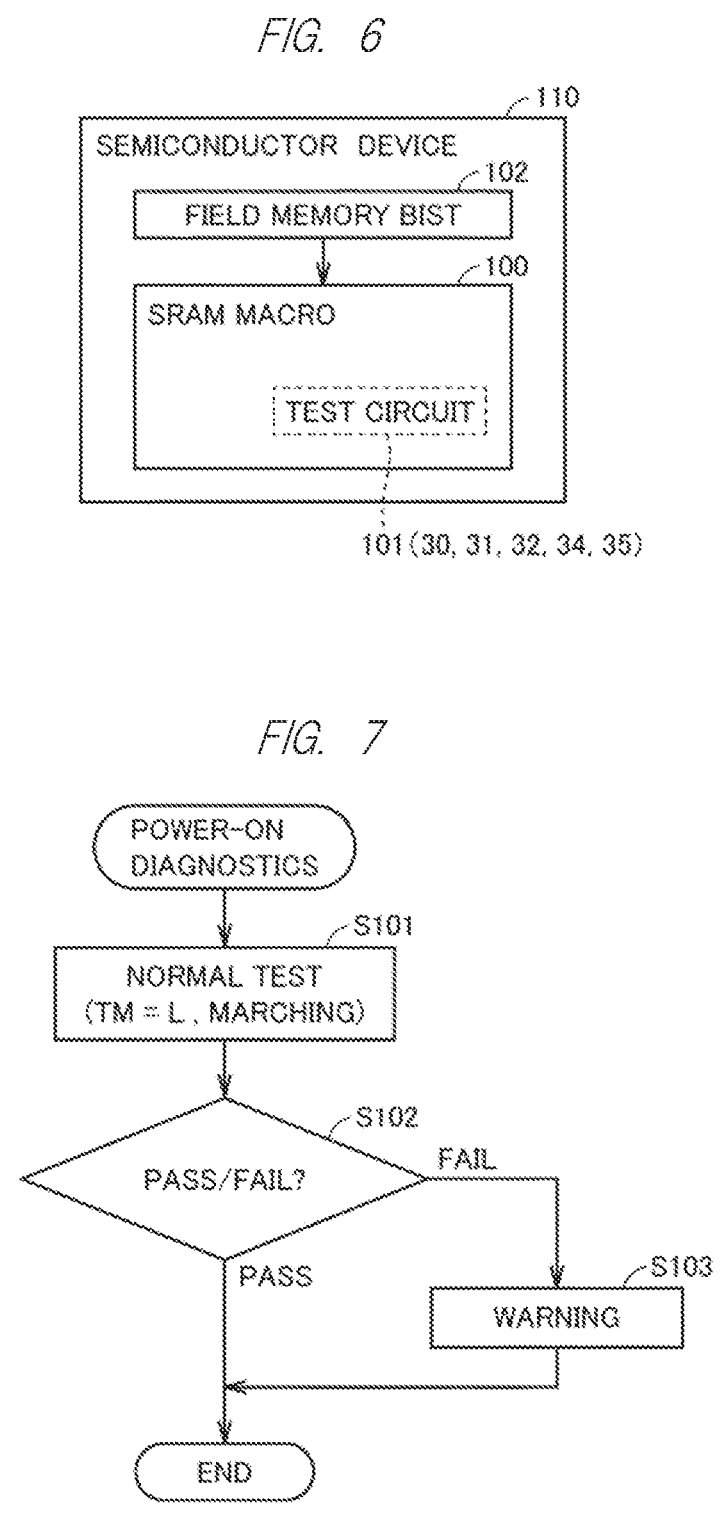

FIG. 6 is a block diagram showing an overall configuration of a semiconductor device according to the first embodiment. Referring to FIG. 6, a semiconductor device (SEMI-CONDUCTOR DEVICE) 110 includes an SRAM circuit 100 and a field memory BIST (FIELD MEMORY BIST) circuit 102.

The SRAM circuit 100 includes power supply voltage reduction circuits 30 to 32 and power supply voltage selection circuits 34, 35 in order to further tighten an operating margin, as described with reference to FIGS. 1 to 5. These circuits are hereinafter generically referred to as a test circuit (TEST CIRCUIT) 101. The SRAM circuit 100 is obtained by adding a test circuit 101 to a conventional SRAM circuit, but an increase in area overhead due to built-in of the test circuit 101 is hardly present. Moreover, the power supply voltage supplied to the SRAM circuit 100 does not need to be reduced for the deterioration prediction test, and the power supply voltage can be locally reduced only by changing the mode.

A BIST is an acronym for a built-in self-test (Built-In Self-Test). The BIST circuit internally includes a test pattern generation circuit and an evaluation circuit of a test result. In particular, the field memory BIST circuit 102 is also capable of executing a runtime diagnostics (RUNTIME DIAGNOSTICS) in addition to a power-on diagnostics (POWER-ON DIAGNOSTICS) of the memory. The power-on diagnostics is a component for detecting an abnormality on the spot when the user starts using the semiconductor device 110. The runtime diagnostics is an component for detecting an abnormality on the spot while the semiconductor device 110 is in operation.

FIG. 7 is a flowchart showing a procedure for a power-on diagnostics. First, the field memory BIST circuit 102 performs an existing normal test (NORMAL TEST) such as a marching test (MARCHING TEST) (S101). In a case of the normal test, the field memory BIST circuit 102 sets the test mode signal TM to an L level (negate). Consequently, supplied to each power supply line PL and the word line WL is the external power supply voltage VDD normally used by the user. If it is assumed that the total number of addresses is N, the marching test requires 12N memory accesses (the number of times of the write and the read).

Next, the field memory BIST circuit 102 determines whether a result of the normal test passes (PASS) or fails (FAIL) (S102). If the normal test result fails (FAIL at S102), the field memory BIST circuit 102 notifies informs the user of a warning (WARNING) (S103). In this case, the SRAM circuit 100 of the semiconductor device 110 is out of order and cannot be used.

Figure 8:
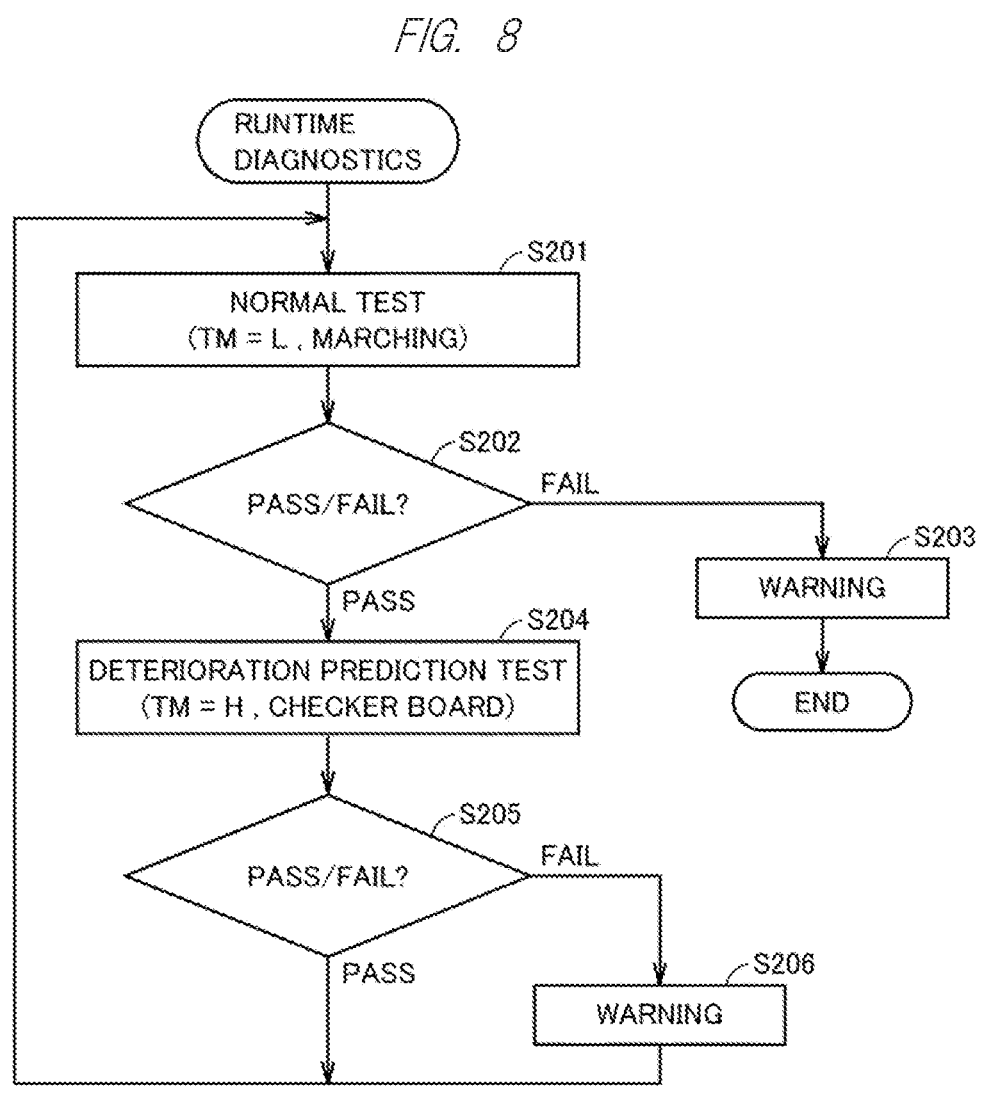

FIG. 8 is a flowchart showing a procedure for a runtime diagnostics. First, the field memory BIST circuit 102 performs an existing normal test such as a marching test (S201). In the normal test, the field memory BIST circuit 102 sets the test mode signal TM to an L level.

Next, the field memory BIST circuit 102 determines whether a result of the normal test passes or fails (S202). If the result of the normal test fails (FAIL at S202), the field memory BIST circuit 102 notifies the user of a warning (S203) and ends this processing. In this case, since the SRAM circuit 100 of the semiconductor device 110 is out of order, the semiconductor device 110 cannot be operated any more.

Meanwhile, if the result of the normal test passes (PASS at S202), the field memory BIST circuit 102 performs a deterioration prediction test (DETERIORATION PREDICTION TEST) (S204). In a case of the deterioration prediction test, the field memory BIST circuit 102 sets the test mode signal TM to an H level (assertion). Consequently, the reduction voltage VDD-α is supplied to the word line WL or the power supply line PL in a test region. In the deterioration prediction test, for example, a checker board (CHECKER BOARD) test is performed. A detailed procedure for the deterioration prediction test will be described later with reference to FIGS. 9A to 9D.

Next, the field memory BIST circuit 102 determines whether a result of the deterioration prediction test passes or fails (S205). If the result of the deterioration prediction test fails (FAIL at S205), the field memory BIST circuit 102 notifies the user of a warning (S206). In this case, since the SRAM circuit 100 of the semiconductor device 110 is not necessarily out of order at present, an operation of the semiconductor device 110 does not need to be stopped.

Then, the field memory BIST circuit 102 returns the processing to first step S201, and repeats the above-mentioned each step periodically or according to a request(s) of a high-order system.

Each of FIGS. 9A to 9D is a diagram for explaining one example of the procedure for performing the deterioration prediction test in FIG. 8. Each figure makes a description of whether a column address CA, a row address RA, an SRAM operation (OPERATION), write data, read data, and a test mode TM are set or not. The column addresses CA range from 0 to 7 and the row addresses RA range from 0 to 255. Therefore, the total number of addresses N is 2048. The SRAM operation includes write (WRITE) and read (READ). Alternately selected in write data (WRITE DATA) are "0000" and "1111". Read data (READ DATA) is an expected value(s) (EXPECTATION) when the SRAM circuit 100 is normal. During the degradation prediction test, the test mode signal TM is asserted to an H level.

First, referring to FIG. 9A, the field memory BIST circuit 102 alternately writes "0000" and "1111" into the memory cells MC in order of addresses. Next, referring to FIG. 9B, the field memory BIST circuit 102 reads data stored in each memory cell MC in order of address. Here, a reason why data of each row with column address CA=0 is finally read again is for performing the read test in a case of the deselected columns.

Then, referring to FIG. 9C, the field memory BIST circuit 102 alternately writes "1111" and "0000" into the memory cells MC in order of addresses. Next, referring to FIG. 9D, the field memory BIST circuit 102 reads data stored in each memory cell MC in order of address. Here, a reason why data of each row with the column address CA=0 is finally read again is for performing the read test in the case of the deselected columns. In this way, the number of accesses to the SRAM circuit 100 by the deterioration prediction test is approximately 4N (N is the total number of addresses). Therefore, the number of memory accesses does not increase significantly.

Effect of First Embodiment

As described above, according to the semiconductor device 110 of the first embodiment, the reduction voltage VDD-α is applied to the power supply line PL during the data read, and the reduction voltage VDD-α is applied to the word line WL during the data write. This makes it possible to perform a test that predicts deterioration of the operating margin of the SRAM in the future.

The above-mentioned supply of the reduction voltage VDD-α is performed by locally lowering the power supply voltage instead of changing the power supply voltage. This makes it unnecessary to implement and build an additional power supply voltage control system for test on production chips. Further, future failures of the SRAM circuit can be detected in advance not only during the power-on but also during actual use of the chip.

Figure 10:
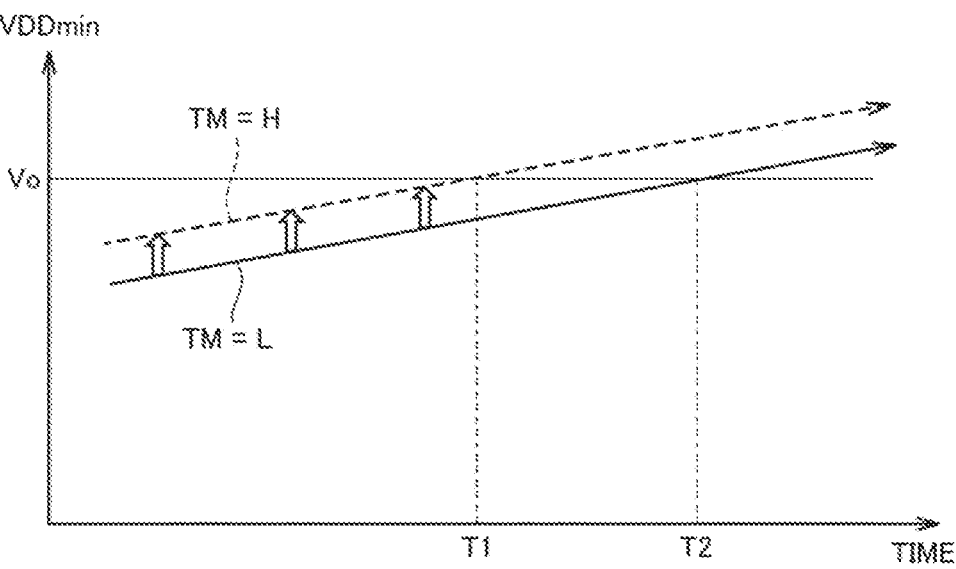
FIG. 10 is a diagram for explaining an effect of the first embodiment.

FIG. 10 is a diagram for explaining an effect of the first embodiment. A vertical axis in FIG. 10 represents the minimum power supply voltage VDDmin at which the SRAM circuit can operate. A horizontal axis of FIG. 10 represents time (TIME). A solid line in FIG. 10 indicates a case of a test mode signal TM=L level, that is, a case of a normal operation. A dashed line in FIG. 10 indicates a case of a test mode (TM=H).

As shown by the solid line in FIG. 10, the operating margin deteriorates over time, so that the minimum power supply voltage VDDmin at which the SRAM circuit can operate increases. When a normal power supply voltage Vo used by the user becomes equal to the minimum power supply voltage VDDmin (time T2), this indicates that the SRAM circuit 100 has been out of order. A characteristic (broken line) in a case of the test mode (TM=H) corresponds to a upward shifted characteristic (solid line) in a case of normal use (TM=L). Therefore, in the test mode, the normal power supply voltage Vo used by the user becomes equal to the minimum power supply voltage VDDmin at time T1 before time T2, so that occurrence of future failures can be predicted.

Second Embodiment

In a second embodiment, a case of adjusting a degree for tightening the operating margin of the SRAM circuit will be described. Specifically, a of the reduction voltage VDD-α is changed in a multiple-stage manner. This makes it possible to specifically predict a failure occurrence timing. Hereinafter, it will be detailed with reference to the drawings.

Modification Point of SRAM Circuit

Figure 11:
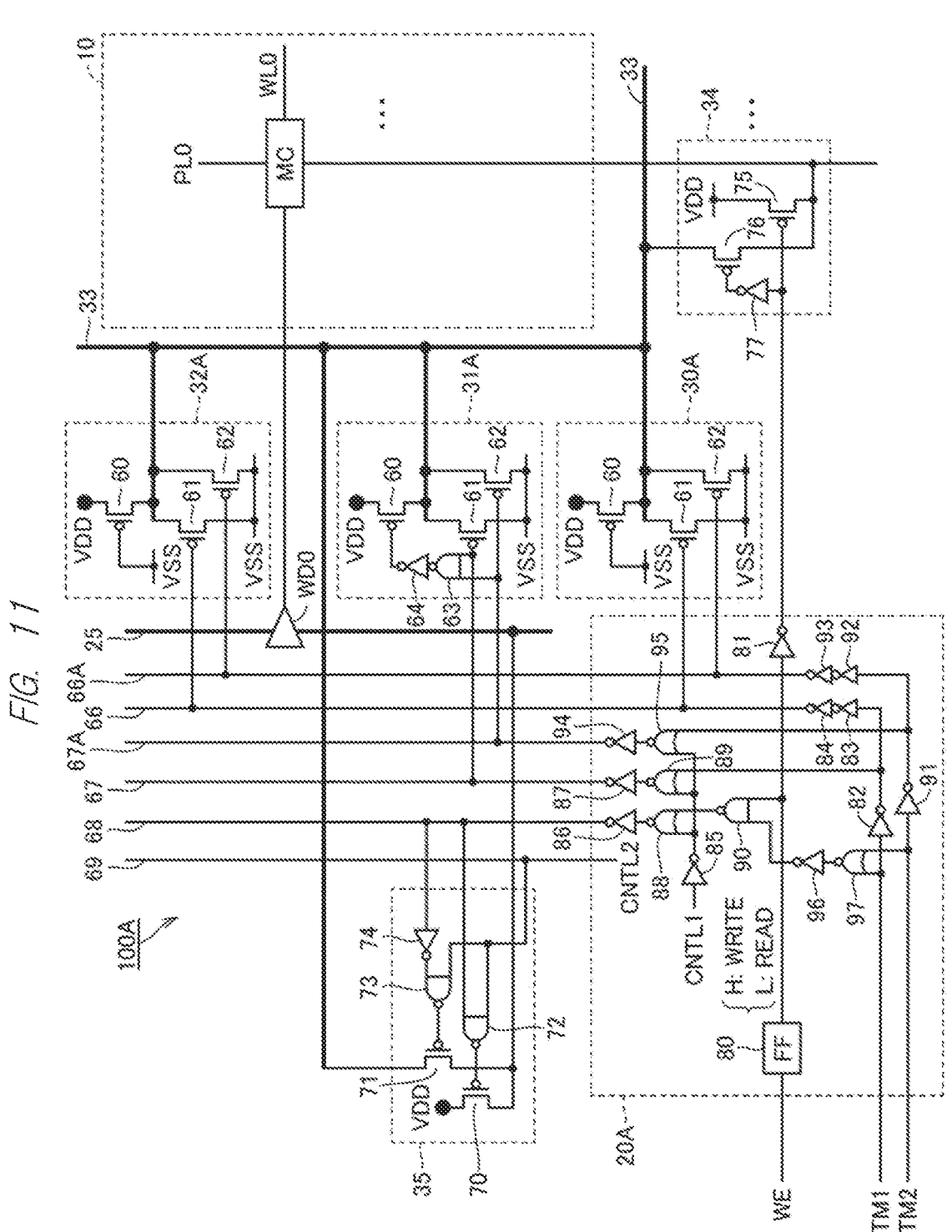
FIG. 11 is a view showing one example of a configuration of a power supply voltage reduction circuit in a SRAM circuit 100A according to a second embodiment.

FIG. 11 is a view showing one example of a configuration of a power supply voltage reduction circuit in a SRAM circuit 100A according to a second embodiment. A circuit diagram of a SRAM circuit 100A in FIG. 11 corresponds to the circuit diagram of the SRAM circuit 100 of the first embodiment in FIG. 5.

Specifically, the SRAM circuit 100A of FIG. 11 differs from the SRAM circuit 100 of FIG. 5 in that the power supply voltage reduction circuits 30 to 32 are replaced with power supply voltage reduction circuits 30A to 32A. A PMOS transistor 62 is provided in parallel with the PMOS transistor 61 in the power supply voltage reduction circuits 30A to 32A of FIG. 11. A current drive capability of the PMOS transistor 62 is smaller than a current drive capability of the PMOS transistor 60, but is greater than a current drive capability of the PMOS transistor 61. As one example, the current drive capability of the PMOS transistor 62 is twice larger than the current drive capability of the PMOS transistor 61.

Here, in a case of the power supply voltage reduction circuits 30A, 32A, inputted into the gate of the PMOS transistor 60 is the reference voltage VSS. Therefore, the PMOS transistor 60 is always on the ON-state. Also, the gate of the PMOS transistor 61 is connected to a signal line 66. A test mode signal TM1 is supplied to the signal line 66 via the inverters 82, 83, 84. Also, the gate of the PMOS transistor 62 is connected to a signal line 66A. A test mode signal TM2 is supplied to the signal line 66A through the inverters 91, 92, 93. Therefore, when the test mode signal TM1 is asserted at an H level, the PMOS transistor 61 becomes an ON-state. When the test mode signal TM2 is asserted at an H level, the PMOS transistor 62 becomes an ON-state.

In a case of the power supply voltage reduction circuit 31A, the gate of the PMOS transistor 61 is connected to a signal line 67, and the gate of the PMOS transistor 62 is connected to a signal line 67A. Inputted into the gate of the PMOS transistor 60 is an AND operation result of the gate signals of the PMOS transistors 61, 62. This AND operation is realized by series connection of the NAND circuit 63 and the inverter 64. Therefore, the PMOS transistor 60 is rendered conductive when the gate signal of at least one of the PMOS transistors 61, 62 is at an L level.

Here, the OR operation result of a signal obtained by inverting the test mode signal TM1 by the inverter 82 and a signal obtained by inverting the control signal CNTL1 by the inverter 85 is inputted to the above-mentioned signal line 67. This OR operation is realized by series connection of an NOR circuit 89 and the inverter 87. Therefore, when the test mode signal TM1 is at the H level and the control signal CNTL1 is at the H level, the PMOS transistors 60, 61 becomes the ON-states.

Similarly, an OR operation result of a signal obtained by inverting the test mode signal TM2 by the inverter 91 and a signal obtained by inverting the control signal CNTL1 by the inverter 85 is inputted to the above-mentioned signal line 67A. This OR operation is realized by series connection of the NOR circuit 95 and the inverter 94. Therefore, when the test mode signal TM2 is at the H level and the control signal CNTL1 is at the H level, the PMOS transistors 60, 62 become the ON-states. When both the test mode signals TM1, TM2 are at the H levels and the control signal CNTL1 is at the H level, all the PMOS transistors 60, 61, 62 become the ON-states.

A controller 20A of FIG. 11 differs from the controller 20 of FIG. 5 in that inverters 91 to 94, 96 and NOR circuits 95, 97 are added. Since the inverters 91 to 94 and the NOR circuit 95 have already been described, a description thereof will not be repeated.

The write enable signal WE is inputted into a first input terminal of the NAND circuit 90, and the OR operation result of the test mode signals TM1, TM2 is inputted into a second input terminal. This OR operation is realized by series connection of the NOR circuit 97 and the inverter 96. Therefore, when the control signal CNTL1 and the write enable signal WE are at the H levels and at least one of the test mode signals TM1, TM2 is at the H level, the reduction voltage VDD-α is supplied to the power supply line 25. This is because the PMOS transistor 70 of the power voltage selection circuit 35 becomes an OFF-state and the PMOS transistor 71 becomes an ON-state in this case. Meanwhile, when the control signal CNTL1 is at the H level and the write enable signal WE is at the L level or both the test mode signals TM1, TM2 are at the L levels, the external power supply voltage VDD is supplied to the power supply line 25. This is because the PMOS transistor 70 of the power supply voltage selection circuit 35 becomes the ON-state and the PMOS transistor 71 becomes the OFF-state in this case. Incidentally, in the above description, it is assumed that the control signal CNTL2 is at the H level.

Other points in FIG. 11 are the same as those in FIG. 5, so that the same or corresponding components are denoted by the same reference numerals and a description thereof will not be repeated.

Figures 12, 13:
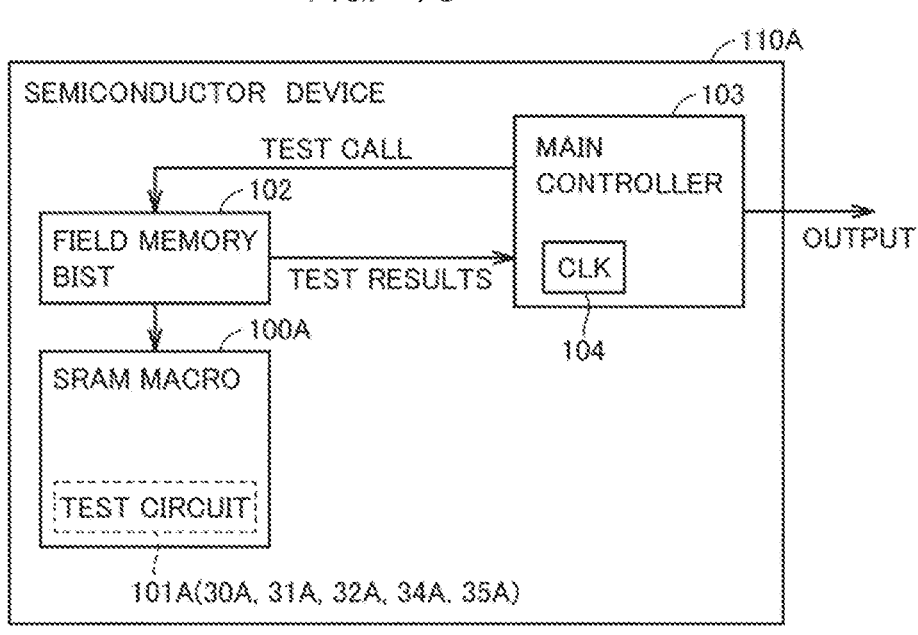
FIG. 12 is a diagram for explaining magnitude of reduction voltages according to test mode signals TM1, TM2.
FIG. 13 is a block diagram showing an overall configuration of a semiconductor device according to a second embodiment.

FIG. 12 is a diagram for explaining magnitude of the reduction voltage according to the test mode signals TM1, TM2. Referring to FIG. 12, a voltage value of a in the reduction voltage VDD-α changes depending on whether the test mode signals TM1, TM2 are asserted at the H levels. Specifically, it is as follows.

(i) When both the test mode signals TM1, TM2 are at the L levels, the PMOS transistor in FIG. 11 becomes the ON-state, but, the PMOS transistors 61, 62 are in the OFF-states. Therefore, α=0, and the external power supply voltage VDD instead of the reduction voltage is supplied to the voltage supply line 33.

(ii) When the test mode signal TM1 is at the H level and the test mode signal TM2 is at L the level, the PMOS transistors 60, 61 are in the ON-state, but the PMOS transistor 62 is in the OFF-state. Therefore, the value of a, that is, an amount of decrease in operating margin is small (SMALL).

(iii) When the test mode signal TM1 is at the L level and the test mode signal TM2 is at the H level, the PMOS transistors 60, 62 are in the ON-states, but the PMOS transistor 61 is in the OFF-state. Therefore, the value of a, that is, the amount of reduction in operating margin becomes medium (MEDIUM). Incidentally, it is assumed that the current drive capability of the PMOS transistor 62 is twice larger than the current drive capability of the PMOS transistor 61.

(iv) When both the test mode signals TM1, TM2 are at the H levels, the PMOS transistors 60, 61, 62 all become the ON-states. Therefore, the value of a, that is, the amount of decrease in operating margin is the largest (LARGE).

[Deterioration Prediction Test]

Next, a method of performing a deterioration prediction test for the SRAM circuit by using the power supply voltage reduction circuits 30A to 32A and the power supply voltage selection circuits 34, 35 shown in FIG. 11 will be described.

FIG. 13 is a block diagram showing an overall configuration of the semiconductor device according to the second embodiment. Referring to FIG. 13, a semiconductor device 110A differs from the semiconductor device 110 of FIG. 6 in that a main controller (MAIN CONTROLLER) 103 is further provided. The main controller 103 includes a processor, a memory (volatile memory and non-volatile memory), and a timing clock circuit (CLK) 104. The processor may be realized as a CPU (Central Processing Unit) of a microcomputer, or by an FPGA (Field Programmable Gate Array). Alternatively, the processor may be realized by other dedicated circuits, or may be realized by a combination of the CPU and the FPGA, and is not particularly limited.

The main controller 103 requests a field memory BIST circuit 102 to start testing (TEST CALL). In response to this, the field memory BIST circuit 102 performs a test of a SRAM circuit 100A, and sends test results (TEST RESULTS) to the main controller 103. The test results include results of normal tests and results of the deterioration prediction tests.

Figure 14:
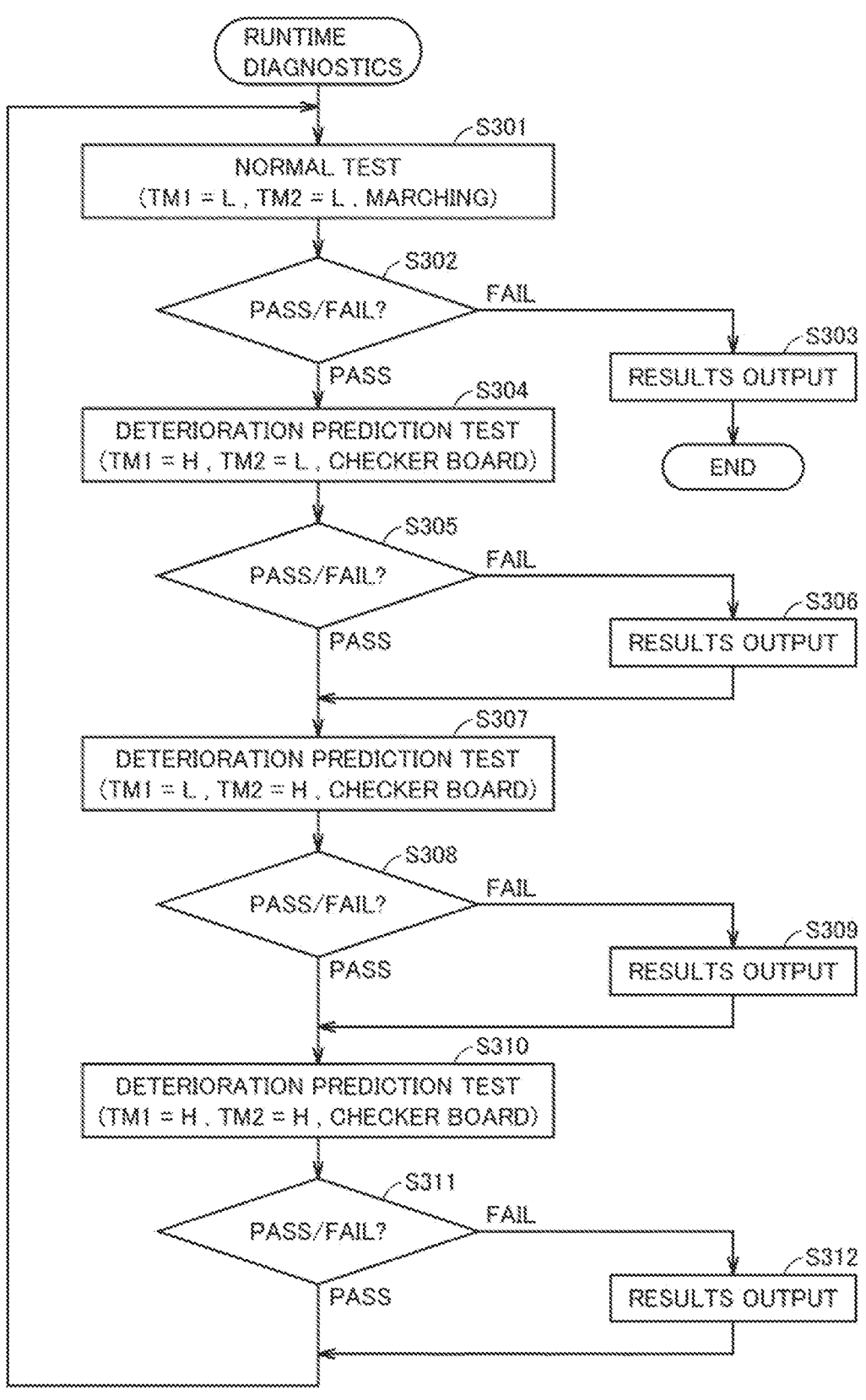
FIG. 14 is a flowchart showing a procedure for a runtime diagnostics in the second embodiment.

FIG. 14 is a flowchart showing a procedure for a runtime diagnostics in the second embodiment. First, the field memory BIST circuit 102 executes an existing normal test such as a marching test (S301). In a case of the normal test, the field memory BIST circuit 102 sets the test mode signals TM1, TM2 to the L levels (negate).

Next, the field memory BIST circuit 102 determines whether a result of the normal test passes or fails (S302). If the result of the normal test fails (FAIL at S302), the field memory BIST circuit 102 outputs the test result to the main controller 103 (RESULTS OUTPUT) (S303). In this case, since the SRAM circuit 10 of the semiconductor device 110A is out of order, the semiconductor device 110A cannot be operated any more. Therefore, the field memory BIST circuit 102 ends the processing.

Meanwhile, if the result of the normal test passes (PASS at S302), the field memory BIST circuit 102 performs the deterioration prediction test with the smallest voltage reduction amount α (S304). Specifically, the field memory BIST circuit 102 sets the test mode signal TM1 to the H level (assert) and sets the test mode signal TM2 to the L level. In the deterioration prediction test, for example, a checker board test is performed.

Next, the field memory BIST circuit 102 determines whether the result of the deterioration prediction test is passes or fails (S305). If the result of the deterioration prediction test fails (FAIL at S305), the field memory BIST circuit 102 outputs the test result to the main controller 103 (S306). In this case, since the SRAM circuit 100A of the semiconductor device 110A is not necessarily out of order at present, the operation of the semiconductor device 110A does not need to be stopped.

Subsequently, the field memory BIST circuit 102 performs the deterioration prediction test with a voltage reduction amount a set to medium (S307). Specifically, the field memory BIST circuit 102 sets the test mode signal TM1 to L the level and sets the test mode signal TM2 to the H level. In the deterioration prediction test, for example, the checker board test is performed.

Next, the field memory BIST circuit 102 determines whether the result of the deterioration prediction test is passes or fails (S308). If the result of the deterioration prediction test fails (FAIL at S308), the field memory BIST circuit 102 outputs the test result to the main controller 103 (S309).

Subsequently, the field memory BIST circuit 102 sets the voltage reduction amount α to the maximum and performs the deterioration prediction test (S310). Specifically, field memory BIST circuit 102 sets both the test mode signals TM1, TM2 to the H levels. In the deterioration prediction test, for example, the checker board test is performed.

Next, the field memory BIST circuit 102 determines whether the result of the deterioration prediction test passes or fails (S311). If the result of the deterioration prediction test fails (FAIL at S311), the field memory BIST circuit 102 outputs the test result to the main controller 103 (S312).

Thereafter, the field memory BIST circuit 102 returns the processing to first step S301, and repeats each of the above-mentioned steps periodically or according to the request of the main controller 103. Incidentally, execution order of steps S304, S307, and S310 mentioned above may be any execution order.

Returning to FIG. 13, the main controller 103 measures, based on the received test results, a time from beginning of use of the semiconductor device 110A until the test result fails. Based on this measurement result, the main controller 103 predicts a timing when the SRAM circuit 100A will fail, and outputs a prediction result to an outside (OUTPUT).

Figures 15, 16:
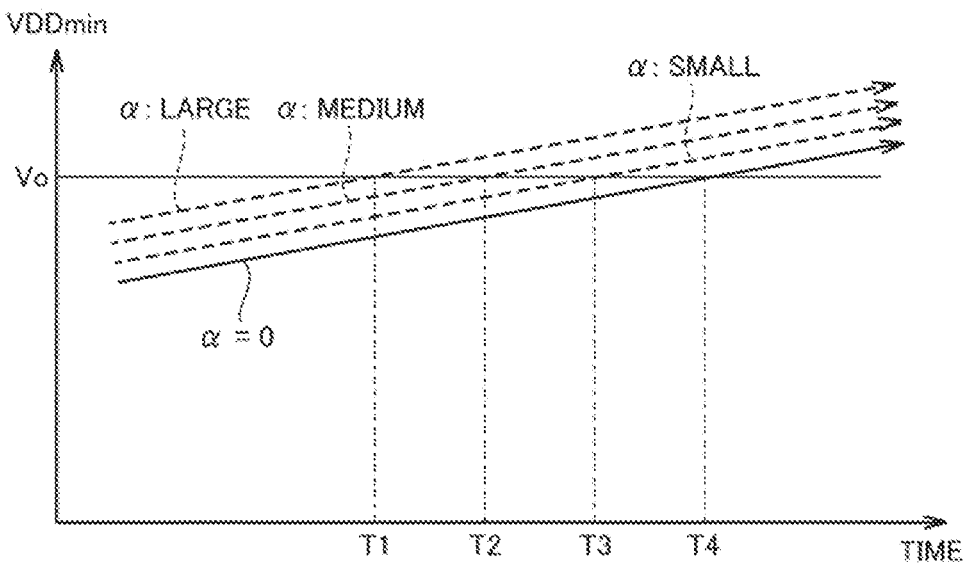
FIG. 15 is a diagram for explaining a prediction method of a failure timing of an SRAM circuit.
FIG. 16 is a flowchart showing a procedure in which a main controller predicts failure time of the semiconductor device in FIG. 13.

FIG. 15 is a diagram for explaining a prediction method of a failure timing of an SRAM circuit. A vertical axis in FIG. 15 represents the minimum power supply voltage VDDmin at which the SRAM circuit can operate. A horizontal axis of FIG. 15 represents time. A solid line in FIG. 15 indicates a case where both the test mode signals TM1, TM2 are at the L levels, that is, a case of a normal operation. A dashed line in FIG. 15 indicates a case where at least one of the test mode signals TM1, TM2 is at the H level.

As shown by the solid line in FIG. 15, the operating margin deteriorates over time, so that the minimum power supply voltage VDDmin at which the SRAM circuit can operate increases. When the normal power supply voltage Vo used by the user becomes equal to the minimum power supply voltage VDDmin (time T4), this indicates that the SRAM circuit 100A has actually been out of order.

Time-dependent change characteristics of the test mode indicated by the dashed line correspond to a case where time-dependent change characteristics in a case of the normal use (TM1, TM2=L) indicated by the solid line are shifted upward. Specifically, in a case of FIG. 15, the test result becomes failure at time T1 where a reduction amount α of the power supply voltage is the largest (that is, TM1=TM2=H). When the reduction amount α of the power supply voltage is moderate (that is, TM1=L, TM2=H), the test result becomes failure at time T2. When the reduction amount α of the power supply voltage is the smallest (that is, TM1=H, TM2=L), the test result becomes failure at time T3. In this case, time T4 at which the actual failure occurs can be estimated by using the measurement results at times T1, T2, and T3.

FIG. 16 is a flowchart showing a procedure in which a main controller predicts failure time of the semiconductor device in FIG. 13. First, based on the test result outputted from the field memory BIST circuit 102, the main controller 103 measures the times T1, T2, T3 until the test result becomes failure according to the power supply voltage reduction amount α (S401). The main controller 103 stores the measured times T1, T2, and T3 in the memory (MEASURE & STORE).

Next, the main controller 103 calculates (CALCULATE) time T4 until the SRAM circuit 100A is actually out of order based on the above-mentioned measurement results (S402). In this case, the failure timing may be experimentally estimated based on a relationship between the time T1, T2, T3 until the test result becomes failure and the voltage reduction amount α, or a residual margin may also be quantified from the voltage reduction amount α.

Next, the main controller 103 outputs, to the outside, the estimated time T4 until the failure occurs (S403). For example, by outputting it to a display device of the system in which the semiconductor device 110A is mounted, the user can be prompted to take measures such as substrate replacement. Alternatively, the main controller 103 may output a failure estimation result(s) to a data center via the network. In this case, the data center can prompt a system administrator to take measures such as substate replacement.

Alternatively, during maintenance of the system in which the semiconductor device 110A is mounted, a maintenance worker may take out information on the failure estimation result stored in the nonvolatile memory of the main controller 103.

Effect of Second Embodiment

As described above, according to the semiconductor device 110A of the second embodiment, the reduction amount α of the power supply voltage can be changed. Consequently, since the memory test can be performed by changing a degree of reduction in the operating margin, failure occurrence timing from a period until the result of the memory test becomes failure can be predicted. Further, since the prediction of the failure occurrence timing is executed by the main controller 103 inside the semiconductor device 110A, no separate processing system is required. Furthermore, since the failure occurrence timing can be predicted with some degree of accuracy before actual failure occurs, the user can be promoted to take action for avoiding the occurrence of the failure before it occurs.

As mentioned above, the invention made by the present inventors has been specifically described based on the embodiments, but, needless to say, the present invention is not limited to the above-mentioned embodiments and can be variously modified within a range not departing from the scope thereof.

What is claimed is:

1. A semiconductor device comprising an SRAM (Static Random Access Memory) circuit operating based on an external power supply voltage, wherein the SRAM circuit includes:

a memory cell array in which a plurality of memory cells including the first memory cell are arranged in a matrix form including a plurality of rows and a plurality of columns;

a first bit line pair extending in a first direction;

a column decoder configured to decode a column address and to select a column corresponding to the decoded column address;

a first word line extending in a second direction intersecting with the first direction;

a row decoder configured to decode a row address and to select a row corresponding to the decoded row address;

a first word line driver driving the first word line;

a first memory cell electrically connected to the first bit line pair and the first word line, wherein the first word line corresponds to one of the plurality of rows, and the first bit line pair corresponds to one of the plurality of columns;

a first power supply line supplying an operating voltage to the first memory cell;

a power supply voltage reduction circuit generating a reduction voltage obtained by lowering the external power supply voltage, and outputting the reduction voltage to a voltage supply line;

the voltage supply line coupled to the first power supply voltage selection circuit and the second power supply voltage selection circuit;

a first power supply voltage selection circuit selecting, as a drive voltage of the first word line driver, one of the external power supply voltage or the reduction voltage supplied from the voltage supply line based on test data being written into or reading from the first memory cell;

a second power supply voltage selection circuit selecting, as the operating voltage supplied from the first power supply line to the first memory cell, one of the external power supply voltage or the reduction voltage supplied from the voltage supply line based on test data being written into or reading from the first memory cell; and an internal controller switching a mode of the SRAM circuit between a normal mode and a test mode by controlling the power supply voltage reduction circuit and the first and second power supply voltage selection circuits, wherein, in the normal mode, the internal controller causes the first power supply voltage selection circuit and the second power supply voltage selection circuit to select the external power supply voltage, wherein, in the test mode, the internal controller causes the first power supply voltage selection circuit to select the reduction voltage as the drive voltage of the first word line driver when writing test data into the first memory cell and to select the external power supply voltage as the drive voltage of the first word line driver when reading test data from the first memory cell, and causes the second power supply voltage selection circuit to select the external power supply voltage as the voltage supplied to the first power supply line when writing the test data and to select the reduction voltage as the voltage supplied to the first power supply line when reading the test data, wherein the voltage supply line is arranged between the memory cell array and the column decoder in the second direction, wherein the second power supply voltage selection circuit is individually arranged for each column of the memory cell array between the memory cell array and the column decoder, and wherein the first power supply voltage selection circuit is arranged between the memory cell array and the row decoder, and is arranged in the second direction with respect to and adjacent to the second power supply voltage selection circuit.

2. The semiconductor device according to claim 1, wherein the SRAM circuit includes:

a second bit line pair extending in the first direction;

a second memory cell electrically connected to the second bit line pair and the first word line;

a second power supply line supplying an operating voltage to the second memory cell; and a third power supply voltage selection circuit selecting one of the external power supply voltage or the reduction voltage as the operating voltage supplied to the second power supply line, and wherein the internal controller causes the third power supply voltage selection circuit to select the reduction voltage as a voltage supplied to the second power supply line when reading the test data from the first memory cell in the test mode.

3. The semiconductor device according to claim 1, wherein the power supply power reduction voltage is capable of selecting, as the reduction voltage, a first reduction voltage and a second reduction voltage lower than the first reduction voltage.

4. The semiconductor device according to claim 3, further comprising a BIST (Built-in Self-Test) circuit, wherein the BIST circuit determines whether test data written in the first memory cell in the test mode matches the test data read from the first memory cell after writing the test data in the test mode, and outputs a determination result.

5. The semiconductor device according to claim 4, further comprising a main controller receiving the determination result from the BIST circuit, wherein the main controller records a lapsed time from beginning of use of the semiconductor device until an inconsistency between the written test data and the read test data occurs.

6. The semiconductor device according to claim 5, wherein the main controller predicts failure timing of the SRAM circuit in the semiconductor device based on the lapsed time when the first reduction voltage is selected as the reduction voltage and the lapsed time when the second reduction voltage is selected as the reduction voltage.

7. The semiconductor device according to claim 6, wherein the main controller outputs the predicted failure timing to an outside of the semiconductor device.

8. The semiconductor device according to claim 3, wherein the power supply voltage reduction circuit includes:

a first transistor connected between a power supply node receiving the external power supply voltage and an output node outputting the reduction voltage;

a second transistor connected between a ground node receiving a reference voltage and the output node; and a third transistor connected to the second transistor in parallel, wherein a current drive capability of the first transistor is larger than a current drive capability of the second transistor, and is larger than a current drive capability of the third transistor, and wherein the current drive capability of the third transistor is larger than the current drive capability of the second transistor.

9. The semiconductor device according to claim 1, wherein the power supply voltage reduction circuit includes:

a first transistor connected between a power supply node receiving the external power supply voltage and an output node outputting the reduction voltage; and a second transistor connected between a ground node receiving a reference voltage and the output node, and wherein a current drive capability of the first transistor is larger than a current drive capability of the second transistor.

10. A testing method for SRAM circuit, the SRAM circuit comprising a power supply voltage reduction circuit generating a reduction voltage obtained by lowering an external power supply voltage and outputting the reduction voltage to a voltage supply line, a first power supply voltage selection circuit selecting, as a drive voltage of a first word line driver that drives a first word line connected to a first memory cell, one of the external power supply voltage or the reduction voltage supplied from the voltage supply line, a second power supply voltage selection circuit selecting, as an operating voltage supplied from a first power supply line to the first memory cell, one of the external power supply voltage or the reduction voltage supplied from the voltage supply line, and an internal controller for setting the SRAM circuit to a test mode by controlling the power supply voltage reduction circuit and the first and second power supply voltage selection circuits, the testing method being performed when the SRAM circuit is in the test mode, the testing method comprising:

causing, by the internal controller, the first power supply voltage selection circuit to select the reduction voltage as the drive voltage of the first word line driver and causing, by the internal controller, the second power supply voltage selection circuit to select the external power supply voltage as the operating voltage supplied from the first power supply line to the first memory cell, and, in that state, writing first test data into the first memory cell;

causing, by the internal controller, the first power supply voltage selection circuit to select the external power supply voltage as the drive voltage of the first word line driver and causing, by the internal controller, the second power supply voltage selection circuit to select the reduction voltage as the operating voltage supplied from the first power supply line to the first memory cell, and, in that state, reading the first test data from the first memory cell; and determining whether the written first test data matches the read first test data.

11. The testing method according to claim 10, further comprising:

in a state of supplying a second reduction voltage, which reduces the external power supply voltage as a drive voltage and is lower than the first reduction voltage, to the first word line driver and in a state of supplying the external power supply voltage to the first power supply line, writing second test data in the first memory cell;

in a state of supplying the external power supply voltage as a drive voltage to the first word line driver and in a state of supplying the second reduction voltage to the first power supply line, reading the written second test data from the first memory cell;

determining whether the written second test data matches the read second test data;

measuring a lapsed time from beginning of use of the SRAM circuit until an inconsistency between respective pieces of the first test data and the second test data occurs; and predicting failure timing of the SRAM circuit based on the measured lapsed time.

* * * * *